(12) United States Patent
Tomimbang

(10) Patent No.: US 8,995,098 B2
(45) Date of Patent: Mar. 31, 2015

(54) MISWIRE PROTECTION AND ANNUNCIATION OF SYSTEM CONDITIONS FOR ARC FAULT CIRCUIT INTERRUPTERS AND OTHER WIRING DEVICES

(75) Inventor: Wendell E. Tomimbang, Kissimmee, FL (US)

(73) Assignee: True-Safe Technologies, Inc., St. Cloud, FL (US)

( * ) Notice: Subject to any disclaimer, the term of this patent is extended or adjusted under 35 U.S.C. 154(b) by 0 days.

(21) Appl. No.: 13/528,809

(22) Filed: Jun. 20, 2012

(65) Prior Publication Data

US 2013/0188290 A1     Jul. 25, 2013

Related U.S. Application Data

(63) Continuation-in-part of application No. 13/274,291, filed on Oct. 14, 2011, now Pat. No. 8,817,431.

(51) Int. Cl.
| | |
|---|---|
| *H02H 3/00* | (2006.01) |
| *H02H 9/08* | (2006.01) |
| *H02H 1/00* | (2006.01) |
| *H02H 11/00* | (2006.01) |
| *G01R 31/04* | (2006.01) |
| *G01R 31/02* | (2006.01) |

(52) U.S. Cl.
CPC .............. *H02H 1/00* (2013.01); *H02H 1/0015* (2013.01); *H02H 11/002* (2013.01); *G01R 31/041* (2013.01); *G01R 31/024* (2013.01)
USPC ........................................... 361/42; 361/115

(58) Field of Classification Search
USPC .................................................... 361/42, 115
See application file for complete search history.

(56) References Cited

U.S. PATENT DOCUMENTS

| | | | | |
|---|---|---|---|---|
| 6,052,265 | A * | 4/2000 | Zaretsky et al. | 361/42 |
| 6,266,219 | B1 * | 7/2001 | Macbeth et al. | 361/42 |
| 6,421,214 | B1 * | 7/2002 | Packard et al. | 361/7 |
| 6,570,392 | B2 * | 5/2003 | Macbeth et al. | 324/536 |
| 6,628,486 | B1 * | 9/2003 | Macbeth | 361/42 |
| 7,298,598 | B1 * | 11/2007 | Morgan et al. | 361/45 |
| 7,925,458 | B2 * | 4/2011 | Kolker et al. | 702/59 |
| 7,986,148 | B2 * | 7/2011 | Mernyk et al. | 324/536 |
| 2003/0165037 | A1 * | 9/2003 | Liscinksy | 361/78 |
| 2010/0097733 | A1 * | 4/2010 | Tomimbang | 361/42 |
| 2011/0216451 | A1 * | 9/2011 | Haines et al. | 361/42 |
| 2012/0089266 | A1 * | 4/2012 | Tomimbang et al. | 700/293 |
| 2013/0188290 | A1 * | 7/2013 | Tomimbang | 361/115 |

\* cited by examiner

*Primary Examiner* — Thienvu Tran
*Assistant Examiner* — Angela Brooks
(74) *Attorney, Agent, or Firm* — The Miller Law Offices PLC; Steven J. Miller, Esq.

(57) ABSTRACT

Electrical distribution systems, equipment and wiring devices are required to have their wiring connections properly identified to ensure proper operation of connected loads as well as the safety of users, however, errors in installation do occur. Electrical wiring errors are commonly called miswire conditions. The current invention is an integrated system and method of miswire protection and annunciation of system conditions for Arc Fault Circuit Interrupters (AFCIs) and other wiring devices, electrical systems and equipment. Electrical code and regulatory standards require certain wiring devices to include miswire protection with their standard features. These wiring devices, among others include Arc Fault Circuit Interrupters (AFCIs) and Ground Fault Circuit Interrupters (GFCIs) which are required to incorporate protection from miswire conditions with other electrical faults they are designed to protect circuits from, such as and including arc, ground, overload, short circuit, and surge.

18 Claims, 14 Drawing Sheets

FIG. 1A

LEGEND FOR REFERENCE NUMERALS OF FIGURE 1:

(1) LINE-SIDE LINE TERMINAL OR CONNECTION
(2) LINE-SIDE NEUTRAL TERMINAL OR CONNECTION
(3) LINE-SIDE GROUND TERMINAL OR CONNECTION
(4) LOAD-SIDE LINE TERMINAL OR CONNECTION
(5) LOAD-SIDE NEUTRAL TERMINAL OR CONNECTION
(6) LOAD-SIDE GROUND TERMINAL OR CONNECTION
(7) HALL-EFFECT CURRENT SENSOR (HECS) INTEGRATED CIRCUIT or CURRENT SENSOR
(8) BUFFER AMPLIFIER and HECS MEASUREMENT PHASE SHIFT CORRECTION CIRCUIT
(9) SWITCH-MODE POWER SUPPLY (SMPS) or ALTERNATE DC POWER SUPPLY
(10) ANTI-ALIAS FILTER
(11) MICROPROCESSOR
(12) ELECTROMAGNETIC TRIP AND RESET MECHANISM or CONTACTOR
(13) TRIP AND RESET SWITCHING CIRCUIT
(14) TRIP AND RESET SENSING OR INDICATOR CIRCUIT
(15) RESET SWITCH or RESET BUTTON
(16) TEST SWITCH, TRIP SWITCH or TRIP BUTTON
(17) FAULT / END-OF-LIFE LED INDICATORS, POWER-ON / MISWIRE LED INDICATORS or VISUAL INDICATORS
(18) AUDIBL E INDICATOR or INDICATORS
(19) BUFF ER AMPLIFIER
(20) FUNDAMENTAL FREQUENCY INTERRUPT
(21) HECS ADC MEASUREMENTS
(21A) HECS ZERO REFERENCE OFFSET VOLTAGE VALUE
(22) VOLTAGE DIVIDER CIRCUIT
(23) METAL OXIDE VARISTOR
(24) RESET SOLENOID
(25) TRIP SOLENOID
(26) CONTACTOR CONTACTS
(27) SILICONE-CONTROL LED RECTIFIER (SCR), THYRISTOR OR OTHER SOLID STATE SWITCHING DEVICES
(28) SILICONE-CONTROL LED RECTIFIER (SCR), THYRISTOR OR OTHER SOLID STATE SWITCHING DEVICES

FIG. 2A

LEGEND FOR REFERENCE NUMERALS OF FIGURE 2:

(1) LINE-SIDE LINE TERMINAL OR CONNECTION
(2) LINE-SIDE NEUTRAL TERMINAL OR CONNECTION
(3) LINE-SIDE GROUND TERMINAL OR CONNECTION
(4) LOAD-SIDE LINE TERMINAL OR CONNECTION
(5) LOAD-SIDE NEUTRAL TERMINAL OR CONNECTION
(6) LOAD-SIDE GROUND TERMINAL OR CONNECTION
(9) SWITCH-MODE POWER SUPPLY (SMPS) or ALTERNATE DC POWER SUPPLY
(11) MICROPROCESSOR
(12) ELECTROMAGNETIC TRIP AND RESET MECHANISM or CONTACTOR
(13) TRIP AND RESET SWITCHING CIRCUIT
(14) TRIP AND RESET SENSING OR INDICATOR CIRCUIT
(23) METAL OXIDE VARISTOR
(24) RESET SOLENOID
(25) TRIP SOLENOID
(26) CONTACTOR CONTACTS
(27) SILICONE-CONTROL   LED RECTIFIER (SCR), THYRISTOR OR OTHER SOLID STATE SWITCHING DEVICES
(28) SILICONE-CONTROL   LED RECTIFIER (SCR), THYRISTOR OR OTHER SOLID STATE SWITCHING DEVICES
(29) RESISTOR
(30) RESISTOR
(31) OPTICALLY-CONTROLLED   SWITCHING DEVICE or OPTOCOUPLER
(32) OPTICALLY-CONTROLLED   SWITCHING DEVICE or OPTOCOUPLER
(33) AC BRIDGE INTEGRATED CIRCUIT or BRIDGE RECTIFIER CIRCUIT
(34) AC BRIDGE INTEGRATED CIRCUIT or BRIDGE RECTIFIER CIRCUIT
(35) SMPS CIRCUITRY or ATERNATE DC POWER SUPPLY
(36) RESISTOR
(37) RESISTOR
(38) OPTICALLY-CONTROLLED   SWITCHING DEVICE or OPTOCOUPLER
(39) RESISTOR
(40) CAP   ACITOR
(41) CONNECTION TO DC POWER SUPPLY
(42) RESET COMMAND CONNECTION FROM MICROPROCESSOR
(43) TRIP COMMAND CONNECTION FROM MICROPROCESSOR
(44) TRIP/RESET   INDICATOR FEEDBACK TO MICROPROCESSOR
(70) TRIP BUTTON
(71) TRIP SWITCHING CIRCUIT or TRIP CIRCUIT

FIG. 3A

LEGEND FOR REFERENCE NUMERALS OF FIGURE 3:

(1)  LINE-SIDE LINE TERMINAL OR CONNECTION
(2)  LINE-SIDE NEUTRAL TERMINAL OR CONNECTION
(3)  LINE-SIDE GROUND TERMINAL OR CONNECTION
(4)  LOAD-SIDE LINE TERMINAL OR CONNECTION
(5)  LOAD-SIDE NEUTRAL TERMINAL OR CONNECTION
(6)  LOAD-SIDE GROUND TERMINAL OR CONNECTION
(11) MICROPROCESSOR
(12)  ELECTROMAGNETIC TRIP AND RESET MECHANISM or CONTACTOR
(13)  TRIP AND RESET SWITCHING CIRCUIT
(14)  TRIP AND RESET SENSING OR INDICATOR CIRCUIT
(24)  RESET SOLENOID
(25)  TRIP SOLENOID
(27) SILICONE-CONTROL   LED RECTIFIER (SCR), THYRISTOR OR OTHER SOLID STATE SWITCHING DEVICES
(28) SILICONE-CONTROL   LED RECTIFIER (SCR), THYRISTOR OR OTHER SOLID STATE SWITCHING DEVICES
(29)  RESISTOR
(30)  RESISTOR
(31) OPTICALLY-CONTROLLED   SWITCHING DEVICE or OPTOCOUPLER
(32) OPTICALLY-CONTROLLED   SWITCHING DEVICE or OPTOCOUPLER
(33)   AC BRIDGE INTEGRATED CIRCUIT or BRIDGE RECTIFIER CIRCUIT
(34)   AC BRIDGE INTEGRATED CIRCUIT or BRIDGE RECTIFIER CIRCUIT
(35)   SMPS CIRCUITRY or ATERNATE DC POWER SUPPLY
(36) RESISTOR
(37) RESISTOR
(38) OPTICALLY-CONTROLLED   SWITCHING DEVICE or OPTOCOUPLER
(42)   RESET COMMAND CONNECTION FROM MICROPROCESSOR
(43)   TRIP COMMAND CONNECTION FROM MICROPROCESSOR
(44) TRIP/RESET   INDICATOR FEEDBACK TO MICROPROCESSOR
(45)   DOUBLE-SOLENOID CONTACTOR CONTACTS
(46)   CONNECTION TO DC POWER SUPPLY
(47) AUXILIARY   CONTACT – NORMALLY OPEN
(48) AUXILIARY   CONTACT – NORMALLY CLOSE
(49) RESISTOR
(50) RESISTOR
(51) OPTICALLY-CONTROLLED   SWITCHING DEVICE or OPTOCOUPLER
(52) RESISTOR
(53) RESISTOR
(54)   LINE-SIDE LINE CONNECTION FOR LINE-NEUTRAL MISWIRE INDICATOR CIRCUIT

FIG. 3B

LEGEND FOR REFERENCE NUMERALS OF FIGURE 3:

(55) LINE-SIDE NEUTRAL CONNECTION FOR LINE-NEUTRAL MISWIRE INDICATOR CIRCUIT
(56) LINE-NEUTRAL MISWIRE INDICATOR CIRCUIT
(68) RESISTOR
(70) TRIP BUTTON
(71) TRIP SWITCHING CIRCUIT or TRIP CIRCUIT

FIG. 4A

LEGEND FOR REFERENCE NUMERALS OF FIGURE 4:

- (1) LINE-SIDE LINE TERMINAL OR CONNECTION
- (2) LINE-SIDE NEUTRAL TERMINAL OR CONNECTION
- (3) LINE-SIDE GROUND TERMINAL OR CONNECTION
- (4) LOAD-SIDE LINE TERMINAL OR CONNECTION
- (5) LOAD-SIDE NEUTRAL TERMINAL OR CONNECTION
- (6) LOAD-SIDE GROUND TERMINAL OR CONNECTION
- (11) MICROPROCESSOR
- (14) TRIP AND RESET SENSING OR INDICATOR CIRCUIT
- (33) AC BRIDGE INTEGRATED CIRCUIT or BRIDGE RECTIFIER CIRCUIT
- (34) AC BRIDGE INTEGRATED CIRCUIT or BRIDGE RECTIFIER CIRCUIT
- (35) SMPS CIRCUITRY or ATERNATE DC POWER SUPPLY
- (36) RESISTOR
- (37) RESISTOR
- (38) OPTICALLY-CONTROLLED SWITCHING DEVICE or OPTOCOUPLER
- (44) TRIP/RESET INDICATOR FEEDBACK TO MICROPROCESSOR
- (46) CONNECTION TO DC POWER SUPPLY
- (51) OPTICALLY-CONTROLLED SWITCHING DEVICE or OPTOCOUPLER
- (52) RESISTOR
- (53) RESISTOR
- (54) LINE-SIDE LINE CONNECTION FOR LINE-NEUTRAL MISWIRE INDICATOR CIRCUIT
- (55) LINE-SIDE NEUTRAL CONNECTION FOR LINE-NEUTRAL MISWIRE INDICATOR CIRCUIT
- (56) LINE-NEUTRAL MISWIRE INDICATOR CIRCUIT
- (57) CONTACT OR WITH SOLENOID-ACTUATED TRIP AND MANUAL RESET MECHANISM
- (58) MANUAL RESET BUTTON OF CONTACTOR
- (59) CONTACT OR CONTACTS
- (60) AUXILIARY CONTACT – NORMALLY OPEN
- (61) AUXILIARY CONTACT – NORMALLY CLOSE
- (62) TRIP SOLENOID
- (63) SILICONE-CONTROLLED RECTIFIER (SCR), THYRISTOR OR OTHER SOLID STATE SWITCHING DEVICES
- (64) RESISTOR
- (65) RESISTOR
- (66) OPTICALLY-CONTROLLED SWITCHING DEVICE or OPTOCOUPLER
- (67) TRIP COMMAND CONNECTION FROM MICROPROCESSOR
- (68) RESISTOR
- (69) RESET INDICATOR CONNECTION TO MICROPROCESSOR

FIG. 4B

LEGEND FOR REFERENCE NUMERALS OF FIGURE 4:

(71) TRIP BUTTON TRIP SWITCH
(72) LINE-NEUTRAL MISWIRE INDICATOR CIRCUIT FEEDBACK CONNECTION TO MICROPROCESSOR
(73) LINE-NEUTRAL MISWIRE INDICATOR CIRCUIT FEEDBACK TO MICROPROCESSOR

FIG. 5A

LEGEND FOR REFERENCE NUMERALS OF FIGURE 5:

(1) LINE-SIDE LINE TERMINAL OR CONNECTION
(2) LINE-SIDE NEUTRAL TERMINAL OR CONNECTION
(3) LINE-SIDE GROUND TERMINAL OR CONNECTION
(4) LOAD-SIDE LINE TERMINAL OR CONNECTION
(5) LOAD-SIDE NEUTRAL TERMINAL OR CONNECTION
(6) LOAD-SIDE GROUND TERMINAL OR CONNECTION
(11) MICROPROCESSOR
(14) TRIP AND RESET SENSING OR INDICATOR CIRCUIT
(33) AC BRIDGE INTEGRATED CIRCUIT or BRIDGE RECTIFIER CIRCUIT
(34) AC BRIDGE INTEGRATED CIRCUIT or BRIDGE RECTIFIER CIRCUIT
(35) SMPS CIRCUITRY or ATERNATE DC POWER SUPPLY
(36) RESISTOR
(37) RESISTOR
(38) OPTICALLY-CONTROLLED SWITCHING DEVICE or OPTOCOUPLER
(44) TRIP/RESET INDICATOR FEEDBACK TO MICROPROCESSOR
(46) CONNECTION TO DC POWER SUPPLY
(51) OPTICALLY-CONTROLLED SWITCHING DEVICE or OPTOCOUPLER
(52) RESISTOR
(53) RESISTOR
(54) LINE-SIDE LINE CONNECTION FOR LINE-NEUTRAL MISWIRE INDICATOR CIRCUIT
(55) LINE-SIDE NEUTRAL CONNECTION FOR LINE-NEUTRAL MISWIRE INDICATOR CIRCUIT
(56) LINE-NEUTRAL MISWIRE INDICATOR CIRCUIT
(68) RESISTOR
(70) TRIP BUTTON
(71) TRIP SWITCHING CIRCUIT or TRIP CIRCUIT
(73) LINE-NEUTRAL MISWIRE INDICATOR CIRCUIT FEEDBACK TO MICROPROCESSOR

(74) CONTACT OR WITH SINGLE-SOLENOID TRIP & RESET MECHANISM OR CONTACTOR
(75) CONTACT OR CONTACTS
(76) AUXILIARY CONTACT – NORMALLY OPEN
(77) AUXILIARY CONTACT – NORMALLY CLOSE
(78) TRIP and RESET SOLENOID
(79) SILICONE-CONTROLLED RECTIFIER (SCR), THYRISTOR OR OTHER SOLID STATE SWITCHING DEVICES

FIG. 5B

LEGEND FOR REFERENCE NUMERALS OF FIGURE 5:

(80) RESISTOR
(81) RESISTOR
(82) OPTOCOUPLER, SOLID STATE RELAY, or DIGITAL ISOLATION SWITCH
(83) TRIP/RESET COMMAND CONNECTION FROM MICROPROCESSOR

FIGURE 6

| SYSTEM CONDITIONS | VISUAL INDICATION 1 (LED DISPLAY) | VISUAL INDICATION 2 (LCD DISPLAY) | AUDIBLE INDICATION 1 (SINGLE TONE) | AUDIBLE INDICATION 2 (PRE-RECORDED MESSAGES) |
|---|---|---|---|---|
| POWER OFF | RED STEADY LIGHT | OFF or POWER OFF | BEEP or CONTINUOUS TONE | POWER OFF |
| POWER ON | GREEN STEADY LIGHT | ON or POWER ON | SILENT | POWER ON |
| CURRENT | NONE | XXX.XX AMPERES | NONE | NONE |
| VOLTAGE | NONE | XXX.XX VOLTS | NONE | NONE |
| WATTAGE | NONE | XXX.XX WATTS | NONE | NONE |
| ARC FAULT | RED LIGHT BLINKING AT PRE-SET INTERVALS | ARC FAULT | BEEP AT PRE-SET INTERVALS | ARC FAULT - CALL FOR SERVICE |
| GROUND FAULT | RED LIGHT BLINKING AT PRE-SET INTERVALS | GROUND FAULT | BEEP AT PRE-SET INTERVALS | GROUND FAULT - CALL FOR SERVICE |
| OVERLOAD | RED LIGHT BLINKING AT PRE-SET INTERVALS | OVERLOAD | BEEP AT PRE-SET INTERVALS | OVERLOAD - REDUCE LOAD |
| SHORT CIRCUIT | RED LIGHT BLINKING AT PRE-SET INTERVALS | SHORT CIRCUIT | BEEP AT PRE-SET INTERVALS | SHORT CIRCUIT - CALL FOR SERVICE |
| SURGE | RED LIGHT BLINKING AT PRE-SET INTERVALS | SURGE | BEEP AT PRE-SET INTERVALS | SURGE - CALL FOR SERVICE |
| MISWIRE | RED LIGHT BLINKING AT PRE-SET INTERVALS | MISWIRE | BEEP AT PRE-SET INTERVALS | MISWIRE or CHECK WIRING |
| END-OF-LIFE | RED LIGHT BLINKING AT PRE-SET INTERVALS | END-OF-LIFE | BEEP AT PRE-SET INTERVALS | END-OF-LIFE or REPLACE |

NOTES:
1. Optional system conditions such as KVA, Power Factor and others may be incorporated with the visual indications
2. Annunciation may be audible or visual or combination of both with different variations.
3. Annunciation could be within the PSD or remotely through wired or wireless media
4. Above list are only examples of possible annunciation methods for guidance purposes only, and not limiting to other possibilities within the scope of the current invention
5. XXX.XX- these are to indicate numerical values

MISWIRE PROTECTION AND ANNUNCIATION OF SYSTEM CONDITIONS FOR ARC FAULT CIRCUIT INTERRUPTERS AND OTHER WIRING DEVICES

CROSS-REFERENCE TO RELATED APPLICATIONS

This is a continuation-in-part of U.S. patent application Ser. No. 13/274,291, filed On Oct. 14, 2011.

FIELD OF THE INVENTION

The present invention involves the detection of miswire conditions in electrical circuits, equipment and wiring devices, the means to interrupt the power supply to the connected load when the condition exists and means of annunciating system conditions including the occurrence of electrical faults such as arc, ground, overload, short circuit, surge and miswire, among others. The system and method of the current invention may be integrated with the control and monitoring systems of electrical circuits, equipment and wiring devices such as and including AFCIs (Arc Fault Circuit Interrupter) and GFCIs (Ground Fault Circuit Interrupter) that have detection and interruption circuitry with an electrically or electromagnetically-operated TRIP mechanism.

BACKGROUND OF THE INVENTION

With the increasing number of homeowners and non-professional personnel doing electrical wiring, the occurrence of miswire has been on the rise despite efforts of code regulators and electrical manufacturers to provide clear and easy-to-read manuals and installation instructions with electrical equipment and wiring devices. Wiring devices such as and including AFCIs and GFCIs in addition to their standard features, are required to have miswire protection. The current invention is an integrated system and method of miswire protection and annunciation of system conditions for Arc Fault Circuit Interrupters (AFCIs) and other wiring devices, electrical systems and equipment. System conditions include voltage, current, wattage or energy consumption, power on or off, and electrical faults such as and including arc, overload, short circuit, ground and miswire, among others. Prior arts use visual indicators such as lights and/or audible alarms to signal the occurrence of electrical faults and without identification of which faults occur. The current invention involves additional features of annunciation which include pre-recorded, graphic and alpha-numeric display of system conditions and the faults that occur in electrical circuits, equipment or wiring devices such as and including AFCIs and GFCIs. The annunciation may be within the electrical system, equipment or wiring device or in a remote location through wired or wireless interfaces.

For purposes of this invention, the following terms are used and mean the same as or substitute for the other:
a) AC—in electrical terms, this refers to alternating current
b) DC—in electrical terms, this refers to direct current
c) AFCI or AFCIs (in singular or plural form)—commonly known as Arc Fault Circuit Interrupter
d) GFCI or GFCIs (in singular or plural form)—commonly known as Ground Fault Circuit Interrupter
e) PSD or PSDs (in singular or plural form)—Protection System or Device such as an electrical system, equipment or device equipped with a monitoring and control circuit for fault detection and interruption such as and including GFCIs and AFCIs.
f) LINE WIRE—also known as HOT or LIVE wire
g) NEUTRAL WIRE—also known as COLD wire or without potential
h) MICROPROCESSOR—also called microcontroller or a small computer Integrated Circuit with processor, memory and programmable input and output peripherals.
i) TRIP or TRIPPED—term to indicate a contactor or switch position being OFF, a button designation for OFF position, turn OFF or turned OFF, switch OFF.
j) RESET—term to indicate a contactor or switch position being ON, a button designation for "ON" position, turn ON or turned ON.
k) OPTOCOUPLER—an electronic device for switching an isolated circuit
l) SCR or SCRs (in singular or plural form)—SILICON CONTROLLED RECTIFIERS or solid-state switchers reacting to the flow of current to switch a circuit ON or OFF
m) PROPERLY WIRED—in relation to a circuit, equipment or wiring device, means that the LINE-SIDE LINE wire is connected to the LINE-SIDE LINE terminal, the LINE-SIDE NEUTRAL wire is connected to the LINE-SIDE NEUTRAL terminal, the LOAD-SIDE LINE wire is connected to the LOAD-SIDE LINE terminal, and the LOAD-SIDE NEUTRAL wire is connected to the LOAD-SIDE NEUTRAL terminal. Additionally, for grounded circuits, this means that the GROUND wire is connected to the GROUND terminal.
n) LINE-SIDE—means that part of an electrical circuit, equipment or device which is intended for connection of the main power supply.
o) LOAD-SIDE—means that part of an electrical circuit, equipment or device which is intended for connection of the LOAD.
p) SOLENOID-ACTUATED—also mean electromagnetically-actuated, pertains to the method of actuating the RESET or TRIP mechanism of PSDs. When the term electromagnetic is used in conjunction with a TRIP or RESET mechanism or action, it would mean solenoid-actuated.
q) SOLENOID—refers to an assembly consisting of wires wound on a core to produce a uniform magnetic field, a plunger which is actuated by the magnetic field which attaches to a fixture for latching or unlocking RESET or TRIP mechanisms such as those of a contactor.
r) LED—refers to Light Emitting Diodes which are available in different colors and are used for visual annunciation.
s) LCD—refers to Liquid Crystal Display for alphabetic, numeric or alpha-numeric annunciation.
t) NO—for auxiliary contacts mean Normally Open
u) NC—for auxiliary contacts mean Normally Close.
v) PRESS or PRESSED—refers to switching of contacts by pressing a button
w) CODE—as used with and in reference to a microprocessor means the program that drives its input and output peripherals and all other processing functions. Code-driven means the same as software-driven.

The most common miswire conditions relative to PSDs include the following:
LINE-SIDE and LOAD-SIDE reversed wiring—this is when the LINE-SIDE wires are connected to the LOAD-SIDE terminals and the LOAD-SIDE wires connected to the LINE-SIDE terminals of the PSD;
LINE-SIDE LINE and NEUTRAL reversed wiring—this is when the LINE-SIDE LINE wire is connected to the LINE-SIDE NEUTRAL terminal and the LINE-SIDE NEUTRAL Wire is connected to the LINE-SIDE LINE Terminal of the PSD; and LINE-SIDE and LOAD-SIDE crossed wiring—this is when the LINE-SIDE LINE wire is connected to the LOAD-SIDE NEUTRAL terminal, the LINE-SIDE NEUTRAL wire is connected to the LOAD-SIDE LINE terminal, the LOAD-SIDE LINE wire is connected to the LINE-SIDE NEUTRAL terminal and the LOAD-SIDE NEUTRAL wire is connected to the LINE-SIDE LINE terminal of a PSD. While this may be considered a miswire condition by itself, it is actually the combination of the two miswire conditions mentioned above.

The current invention is for PSDs with a detection and interruption system which generally employs a contactor or similar devices with switching and tripping mechanisms. The most common contactors used for PSDs have a solenoid-actuated TRIP mechanism, and a RESET mechanism which could either be manually-actuated or solenoid-actuated. The present invention is applicable to all types and variations of contactors provided with a tripping mechanism.

Although miswire is typically detected the first time a PSD is powered on after installation, miswire detection is integrated into a PSD's code routine and therefore continuously monitored even after the PSD's first use. With a miswire condition present, the PSD will trip whenever the device is RESET, and with certain types of contactors and miswire conditions, the PSD would not turn ON at all, maintaining an OFF position until the wiring is done properly.

To highlight the significance of the present invention, differences with prior arts are cited below for reference:

U.S. Pat. No. 7,751,162B1 (July 2010 Packard et al) disclosed a protective device with miswire protection which is specifically for a Ground Fault Circuit Interrupter device. The miswire circuit included a resistor which is intended to generate a differential current over a pre-determined value. This is different from the present invention which uses a code-driven microprocessor-controlled integrated system and method of detection and interruption.

U.S. Pat. No. 7,633,726B2 (December 2009 Huang et al) disclosed a protective device with miswire protection which is practically a Ground Fault Circuit Interrupter. This patent does not have a circuit to detect miswire conditions on either LINE or LOAD side and only relies on the operation of electromagnetic solenoids for TRIP and RESET of the contactor. When the LINE-SIDE and LOAD-SIDE wires are reversed and the device is on TRIP condition, the device is rendered non-operational since the operation of the TRIP and RESET SOLENOIDS depend only on power being on and device properly wired, which is different from the present invention which uses a code-driven MICROPROCESSOR-controlled integrated system and method of detection and interruption which functions whether the power supply is connected to the LOAD or LINE side of the PSD.

U.S. Pat. No. 7,538,994B2 (May 2009 Bonilla et al) disclosed a protective device with miswire protection which is practically only a Ground Fault Circuit Interrupter device. The disclosure relies on having the GFCI in a TRIPPED or OFF position before first powered on wherein a locking plate is pressed to engage a projection on the back side of the plunger to connect to a secondary contact to close a circuit. The RESET BUTTON when pressed can not engage with the latching plate. Only when the LINE side is powered on that the plunger releases the locking plate and allow RESET to occur. This is different from the present invention which uses a code-driven microprocessor-controlled integrated system and method of detection and interruption. The present invention also do not require that the PSD be initially on OFF position at first installation.

U.S. Pat. No. 7,403,086 B2 (July 2008 Wu et al) like the U.S. Pat. No. 7,633,726B2 (December 2009 Huang et al) Wu et al disclosed a protective device with miswire protection which is practically a Ground Fault Circuit Interrupter and for that particular device and circuitry only which will not apply to any other wiring devices as AFCI or others that are operating in different principles. This patent does not have a circuit to detect miswire conditions on either LINE or LOAD side of the device and only relies on the operation of electromagnetic solenoids for TRIP and RESET of the contactor. When the LINE side wires are miswired to the LOAD side, the device is rendered non-operational since the operation of the TRIP and RESET SOLENOIDs depend only on power being on. This is different from the present invention which uses a code-driven MICROPROCESSOR-controlled integrated system and method of detection and interruption which functions whether the power supply is connected to the LOAD or LINE side of the PSD.

U.S. Pat. No. 6,226,161 B1 (May 2001 Neiger et al)—like all miswire protection patents mentioned above, this patent disclosed a GFCI incorporating a miswire protection which is designed to work only with a GFCI receptacle outlet. In the disclosures of this patent, four bridge circuits are utilized to derive DC power supply to indicate a miswire condition and that the alarm remain on and can not be shut-OFF until corrected. Unlike the present invention the miswire protection detects a miswire condition and feeds it back to the MICROPROCESSOR which through a code-driven routine signals the TRIP circuit to activate the TRIP mechanism and the corresponding signal to activate the annunciation of audible and visual alarms or indicators.

SUMMARY OF THE INVENTION

The current invention is an integrated system and method of miswire protection and annunciation of system conditions for Arc Fault Circuit Interrupters (AFCIs) and other wiring devices, electrical systems and equipment. System conditions include voltage, current, wattage or energy consumption, power on or off, and electrical faults such as and including arc, overload, short circuit, ground and miswire, among others. For purposes of this patent application, a miswire condition could mean any of the following conditions:

LINE-SIDE and LOAD-SIDE reverse wiring—this is when the LINE-SIDE wires are connected to the LOAD-SIDE terminals and the LOAD-SIDE wires connected to the LINE-SIDE terminals of a PSD; or LINE-SIDE LINE and NEUTRAL Reversed wiring—this is when the LINE-SIDE LINE wire is connected to the LINE-SIDE NEUTRAL terminal and the LINE-SIDE NEUTRAL Wire is connected to the LINE-SIDE LINE Terminal of a PSD; or LINE-SIDE and LOAD-SIDE crossed wiring—this is when the LINE-SIDE LINE wire is connected to the LOAD-SIDE NEUTRAL terminal, the LINE-SIDE NEUTRAL wire is connected to the LOAD-SIDE LINE terminal, the LOAD-SIDE LINE wire is connected to the LINE-SIDE NEUTRAL terminal and the LOAD-SIDE NEUTRAL wire is connected to the LINE-SIDE LINE terminal of a PSD. While this may be considered a miswire condition by itself, it is actually the combination of the above-mentioned miswire conditions.

The present invention is intended to detect a miswire condition as part of the PSD code routine which is important especially the first time it is powered ON to allow the installer to make corrections. The invention involves a combination of electrical, electronic, mechanical, electromagnetic and electro-mechanical components which are incorporated into the PSD that implements the detection, interruption and annunciation of system conditions. When the system detects a miswire condition, the MICROPROCESSOR, through a code-driven routine signals the TRIP circuit to activate the TRIP mechanism and the annunciation of audible and visual alarms or indicators. When a miswire condition is detected, power to the connected load is shut OFF through a TRIP mechanism which trips every time the PSD is powered ON until the condition is corrected.

The monitoring and control system of a PSD consists of its detection, switching, interruption and annunciation systems and their components. With a receiver and transmitter interface, the PSD may be operated and monitored through wireless medium from a remote location or control panel. Alternatively, the PSD may be wired with suitable interface to be operated and monitored from a remote location or control panel.

The current invention is for PSDs with a detection and interruption system which generally employs a contactor or similar devices with switching and tripping mechanisms. The most common contactors used for PSDs have a solenoid-actuated TRIP mechanism, and a RESET mechanism which could either be manually-actuated or solenoid-actuated. The present invention is applicable to all types and variations of contactors provided with a tripping mechanism.

The monitoring and control system of a PSD consists of its detection, switching, interruption, and annunciation systems and components. With a receiver and transmitter interface, the PSD may be operated and monitored through wireless medium from a remote location or control panel. Alternatively, the PSD may be wired with suitable interface to be operated and monitored from a remote location or control panel.

The main components of an AFCI, among others include the LINE-SIDE TERMINALS 1/2/3, LOAD-SIDE TERMINALS 4/5/6, HECS 7, BUFFER AMPLIFIER AND PHASE SHIFT CORRECTION CIRCUIT 8, TRIP AND RESET SENSING CIRCUIT 14, TRIP and RESET SWITCHING CIRCUIT 13, AUDIBLE AND VISUAL INDICATORS 17/18, ELECTROMAGNETIC TRIP AND RESET MECHANISM OR CONTACTOR 12, MICROPROCESSOR 11, and DC POWER SUPPLY or SMPS 9.

Figure 1:
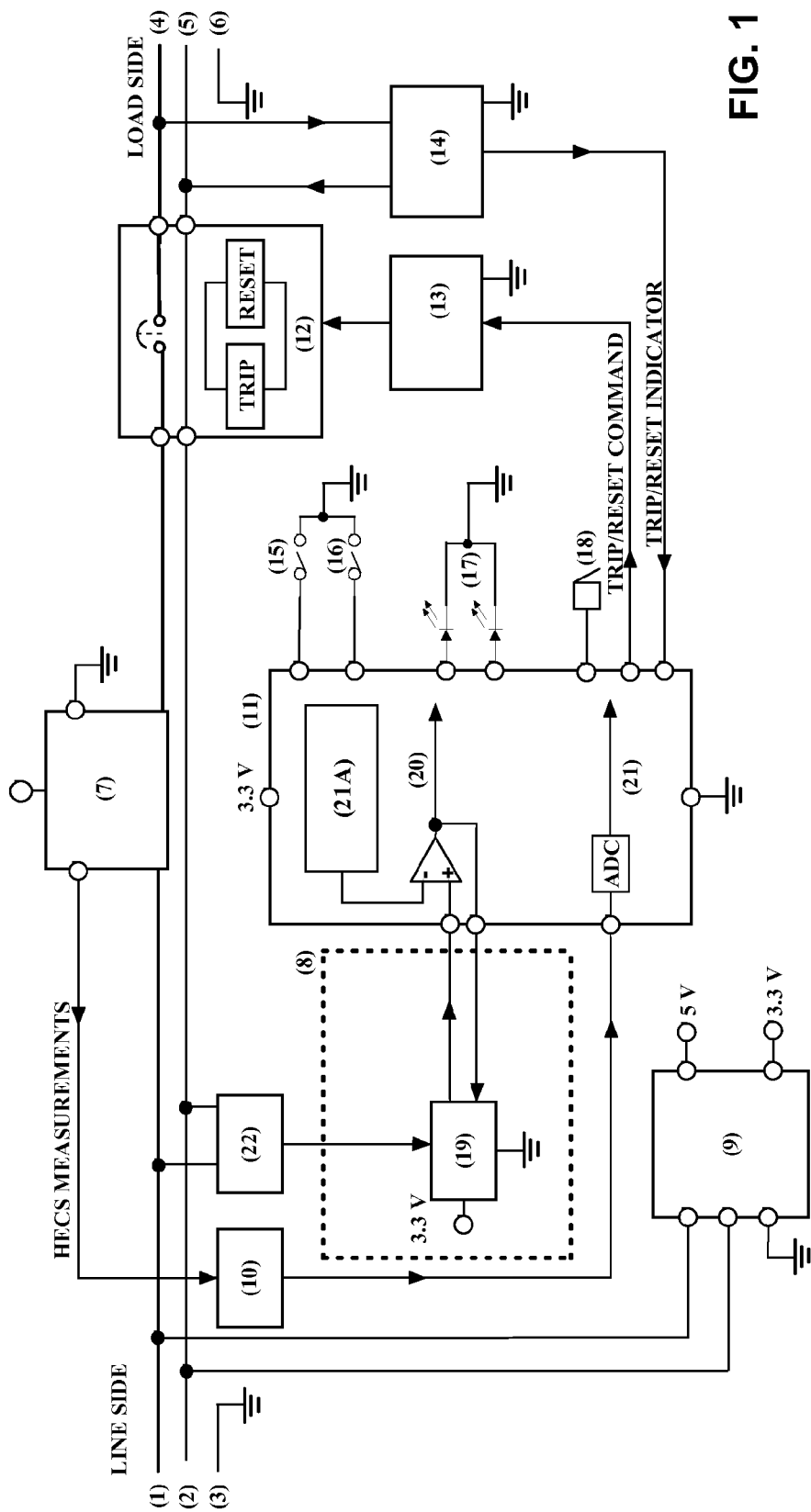
FIG. 1—is derived from a block diagram of an AFCI disclosed in Tomimbang et. al patent application Ser. No. 13/274.291, filed in Oct. 14, 2011. For exemplary purposes and to represent a PSD, an AFCI is used with the current invention. An AFCI provides circuit protection from various electrical faults such as and including arc, surge, short circuit, overcurrent and miswire. It could come in various types such as and including cord, circuit breaker, and receptacle outlet type. The receptacle outlet type AFCI is used as example for purposes of this invention as it is typical of a device with a TRIP and RESET mechanism with LINE-SIDE and LOAD-SIDE utilizing LINE, NEUTRAL and GROUND connections.

The illustration in FIG. 1 of a single-pole CONTACTOR 12 is a representation of a switching device or contactor which could be a single-pole (LINE only), two-pole (LINE and NEUTRAL), or any number of contacts and combinations as applicable for single or multi-phase systems which the current invention may be applied.

A VOLTAGE DIVIDER CIRCUIT 22 is connected across LINE 1 and NEUTRAL 2 on the LINE-SIDE of the PSD.

FIG. 1A—is a legend to the components and parts as illustrated in FIG. 1.

Figure 2:
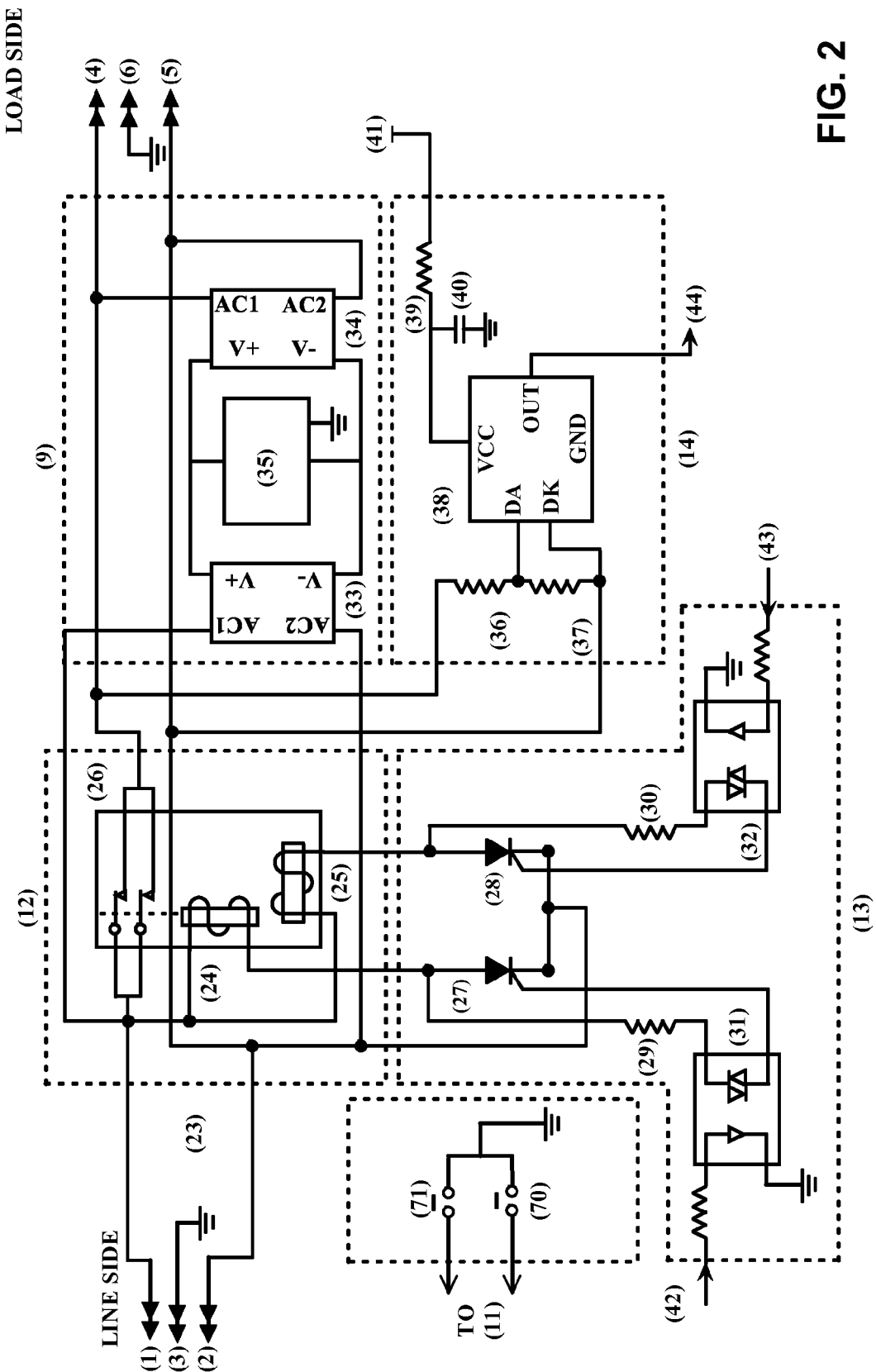

FIG. 2—illustrates a portion of an AFCI circuit disclosed in Tomimbang et. al patent application Ser. No. 13/274,291 filed in Oct. 14, 2011. While the electromagnetic CONTACTOR 12 is diagrammatically shown as a single-pole switching device as illustrated in FIG. 1, it is a representation of a switching device or contactor which could be a single-pole (LINE only), two-pole (LINE and NEUTRAL), or any number of contacts and combinations as applicable for single or multi-phase systems which the current invention may be applied.

This illustration is for a system which uses a double-solenoid CONTACTOR 12 where separate SOLENOIDS 24/25 independently operate the TRIP and RESET functions of the PSD.

The CONTACTOR 12 is equipped with TRIP and RESET BUTTONS 70/71, CONTACT POINTS 26, RESET SOLENOID 24, TRIP SOLENOID 25, and optionally, auxiliary contacts which were not shown on the illustration.

The TRIP AND RESET INDICATOR CIRCUIT 14 is composed of an OPTOCOUPLER 38 and associated electronic components 36/37/38/39/40 which feeds back signal to the MICROPROCESSOR 11 to indicate the CONTACTOR CONTACTS 26 position whether on TRIP or RESET. The components cited are basic and illustrative where an actual circuitry may include other components to satisfy specific design requirements but with the same principles and intents of the current invention.

The TRIP and RESET SWITCHING CIRCUIT 13 is composed of switching devices such as and including SILICON CONTROLLED RECTIFIERS (SCR) 27/28 or thyristors, or other switching devices, OPTOCOUPLERS 31/32 and associated electronic components intended to trigger the RESET or TRIP SOLENOIDS 24/25 through code-driven commands from the MICROPROCESSOR 11 as called for by pressing the RESET or TRIP BUTTONS 70/71, or when an electrical fault occurs. The components cited are basic and illustrative where an actual circuitry may involve other components to satisfy specific design requirements but with the same principles and intents of the current invention. With a receiver and transmitter interface, the PSD may be operated and monitored through wireless medium from a remote location or control panel. Alternatively, the PSD may be wired with suitable interface to be operated and monitored from a remote location or control panel.

FIG. 2A—is a legend to the components and parts as illustrated in FIG. 2.

Figure 3:
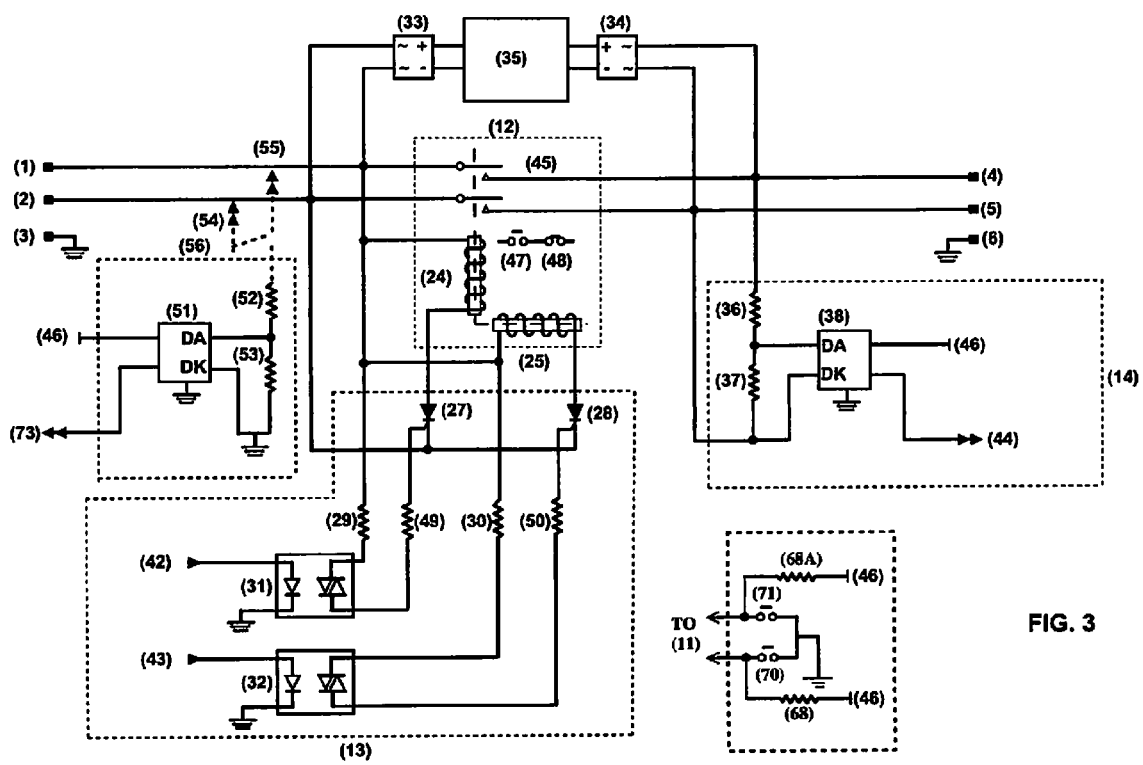

FIG. 3—is a simplified representation of FIG. 2 with a double-solenoid 2-pole CONTACTOR 12 where separate SOLENOIDS 25/24 independently operate the PSD TRIP and RESET functions. The miswire detection and interruption system components are shown. This 2-pole CONTACTOR 12 is typically used on wiring devices such as and including GFCI and AFCI receptacle outlets.

The LINE-NEUTRAL INDICATOR CIRCUIT 56 feeds back signal to the MICROPROCESSOR 11 to determine when the LINE 1 and NEUTRAL 2 wiring connections are reversed.

The TRIP/RESET INDICATOR CIRCUIT 14 feeds back signal to the MICROPROCESSOR 11 to indicate CONTACTOR CONTACTS 45 position.

PULL-UP RESISTORS 68/68A are intended to ensure the input to the MICROPROCESSOR 11 Logic control system for indication of TRIP and RESET conditions are at the expected logic levels. When the TRIP or RESET BUTTONS 71/70 are open, the voltage of the MICROPROCESSOR 11 gate input is pulled up to the level of the input voltage or the DC POWER SUPPLY voltage which is considered logic "HIGH". When the TRIP or RESET BUTTONS are closed, the input voltage at the gate goes to ground or low level which is considered logic "LOW".

With a receiver and transmitter interface, the PSD may be operated and monitored through wireless medium from a remote location or control panel. Alternatively, the PSD may be wired with suitable interface to be operated and monitored from a remote location or control panel.

FIG. 3A—is a legend to the components and parts as illustrated in FIG. 3.

FIG. 3B—is a continuation of the legend of FIG. 3A to the components and parts as illustrated in FIG. 3.

Figure 4:
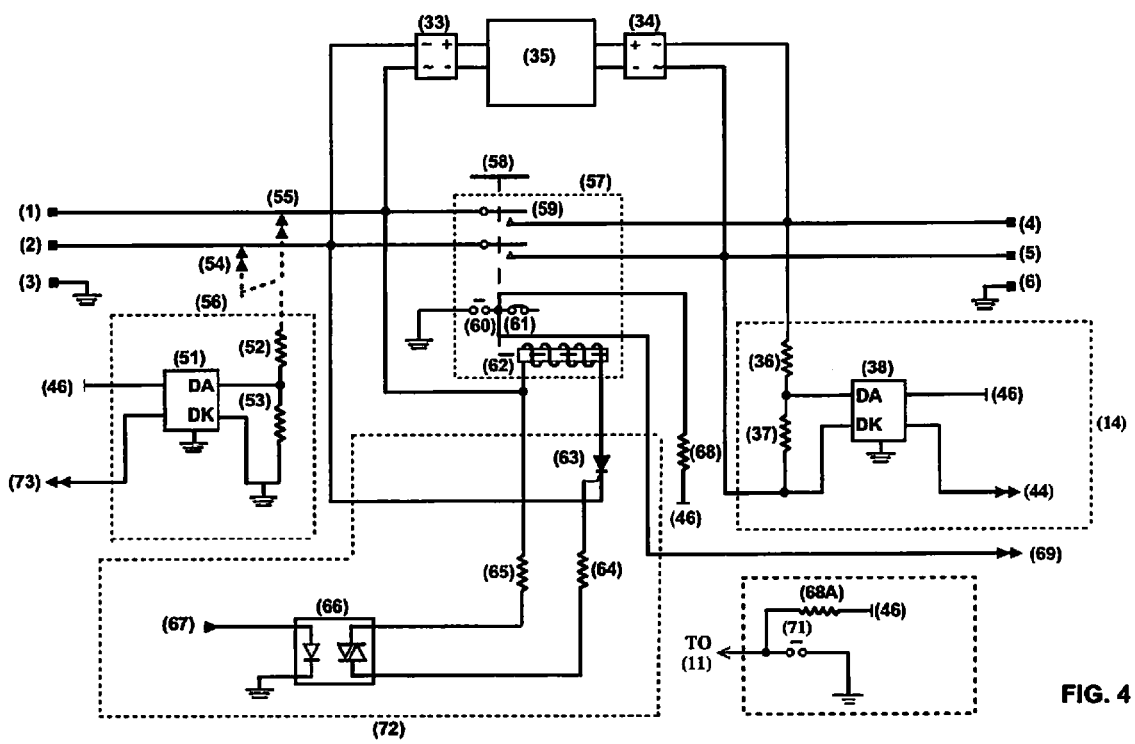

FIG. 4—represents a PSD circuitry utilizing a 2-pole CONTACTOR 57 with a solenoid-actuated TRIP and a manual RESET operation.

The LINE-NEUTRAL INDICATOR CIRCUIT 56 feeds back signal to the MICROPROCESSOR 11 to determine when the LINE 1 and NEUTRAL 2 wiring connections are reversed.

The TRIP/RESET INDICATOR CIRCUIT 14 feeds back signal to the MICROPROCESSOR 11 to indicate CONTACTOR CONTACTS 59 position.

A PULL-UP RESISTOR 68 is connected through the auxiliary contact NO 60 and is intended to ensure the input to the MICROPROCESSOR 11 Logic control system for indication of TRIP and RESET conditions is at the expected logic levels.

When the manual RESET 58 is off and the auxiliary contact NO 60 is open, the voltage of the MICROPROCESSOR 11 gate input is pulled up to the level of the input voltage or the DC POWER SUPPLY voltage which is considered logic "HIGH". When the manual reset is pressed and the auxiliary contact NO 60 is closed, the input voltage at the gate goes to ground or low level which is considered logic "LOW" which according to the MICROPROCESSOR logic control set-up is an indication that the manual RESET 58 switch was pressed.

When the TRIP BUTTON 71 is open, the voltage of the MICROPROCESSOR gate input is pulled up to the level of the input voltage or the DC POWER SUPPLY voltage which is considered logic "HIGH". When the TRIP BUTTON 71 is closed, the input voltage at the gate goes to ground or low level which is considered logic "LOW".

With a receiver and transmitter interface, the PSD may be operated and monitored through wireless medium from a remote location or control panel, with exception of the RESET 58 operation which is manual. Alternatively, the PSD may be wired with suitable interface to be operated and monitored from a remote location or control panel.

FIG. 4A—is a legend to the components and parts as illustrated in FIG. 4.

FIG. 4B—is a continuation of the legend of FIG. 4A to the components and parts as illustrated in FIG. 4.

Figure 5:
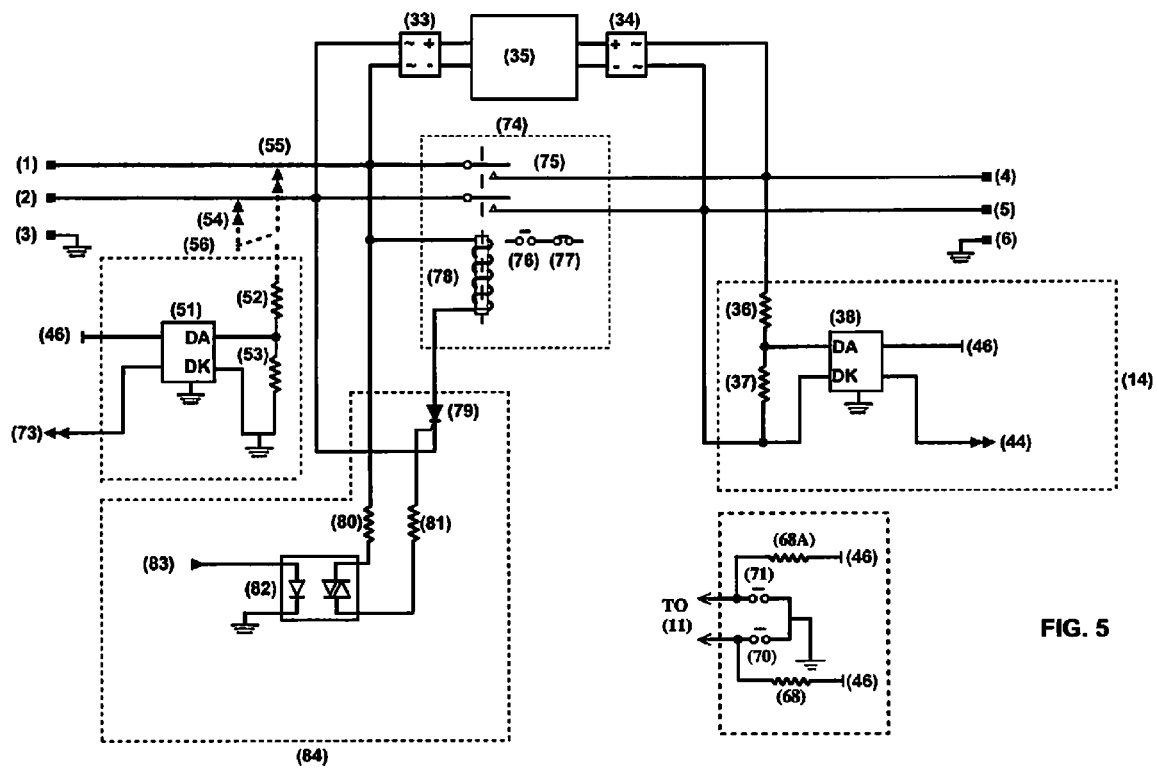

FIG. 5—represents a PSD circuitry with a 2-pole contactor 74 with a single-solenoid-actuated TRIP and RESET operation.

The LINE-NEUTRAL INDICATOR CIRCUIT 56 feeds back signal to the MICROPROCESSOR 11 to determine when the LINE 1 and NEUTRAL 2 wiring connections are reversed. The TRIP/RESET INDICATOR CIRCUIT 14 feeds back signal to the MICROPROCESSOR 11 to indicate CONTACTOR CONTACTS 75 position.

PULL-UP RESISTORS 68/68A are intended to ensure the input to the MICROPROCESSOR 11 Logic control system for indication of TRIP and RESET conditions is at the expected logic levels. When the TRIP or RESET BUTTONS 71/70 are open, the voltage of the MICROPROCESSOR gate input is pulled up to the level of the input voltage or the DC POWER SUPPLY voltage which is considered logic "HIGH". When the TRIP or RESET BUTTONS 71/70 are closed, the input voltage at the gate goes to ground or low level which is considered logic "LOW".

With a receiver and transmitter interface, the PSD may be operated and monitored through wireless medium from a remote location or control panel. Alternatively, the PSD may be wired with suitable interface to be operated and monitored from a remote location or control panel.

FIG. 5A—is a legend to the components and parts as illustrated in FIG. 5.

FIG. 5B—is a continuation of the legend of FIG. 5A to the components and parts as illustrated in FIG. 5.

FIG. 6 Is a table consisting of Annunciation of System and Fault Conditions which shows the different ways and combinations of annunciation of system and fault conditions. The annunciation could be an audible alarm, a visual display or combination thereof, within the PSD itself or remotely. With a receiver and transmitter interface, the PSD may be operated and monitored through wireless medium from a remote location or control panel. Alternatively, the PSD may be wired with suitable interface to be operated and monitored from a remote location or control panel.

DETAILED DESCRIPTION OF EMBODIMENTS

References will now be made in detail to describe the exemplary embodiments of the present invention, which are in part illustrated in the accompanying drawings. Details disclosed herein are not to be interpreted as limiting, but rather as basis for the claims and teaching one skilled in the art how the present invention could be employed in any appropriately detailed system, structure or manner. Wherever possible, the same reference numbers are used throughout the drawings to refer to the same or like components, or functions. System components cited are basic, illustrative and not to be interpreted as limiting, where an actual circuitry may involve other components to satisfy specific design requirements but with the same principles and intents of the current invention.

Miswire protection is an addition to the standard features of a PSD which for an AFCI, include protection from different electrical faults such as arcs, overload, short circuit, surge, among others. For a GFCI, miswire protection is added to its standard features including protection from electrical faults such as ground, overload, short circuit, surge, among others.

The monitoring and control system of a PSD consists of its detection, switching, interruption and annunciation systems and their associated components. With a receiver and transmitter interface, the PSD may be operated and monitored through wireless medium from a remote location or control panel. Alternatively, the PSD may be wired with suitable interface to be operated and monitored from a remote location or control panel. Exclusions apply for remote operation of manual RESET 58.

The system of miswire protection in this invention consists of the LINE-SIDE and LOAD-SIDE terminal connections 1/2/3/4/5/6, a SWITCHED MODE POWER SUPPLY (SNIPS) or alternative DC POWER SUPPLY 9, a CONTACTOR 12/57/74, TRIP and RESET SWITCHING CIRCUIT 13, TRIP AND RESET INDICATOR CIRCUIT 14, MICRO- PROCESSOR 11, INTEGRATED CIRCUIT HALL EFFECT CURRENT SENSOR 7 and other electrical, electronic, electromagnetic, electro-mechanical components and interconnections. These same components are used by the PSD as part of other protection systems which among others include arc, ground, overload, short circuit and surge faults.

Whenever the term connected to, fed to, feeds back to, or any other functional terms in relation to MICROPROCESSOR 11 are used in this invention, they should be interpreted as electrical or electronic connections or signals to specific ports on the MICROPROCESSOR 11 designated for the particular functions the circuits are intended for.

The voltage divider 22 shown in FIG. 1 is intended to maintain current flow to the BUFFER AMPLIFIER AND PHASE SHIFT CORRECTION CIRCUIT 19 of the PSD even when the LINE 1 and NEUTRAL 2 connections are miswired to ensure continuous availability of AC Line reference or synchronization for the MICROPROCESSOR 11. This AC LINE synchronization is required by PSD monitoring and control systems for among others, proper sampling of signals, zero-crossing reference and timing of SCR firing. PSD fault detection code routines are based on analysis of HECS 7 outputs. Likewise, system conditions such as and including voltage, current, wattage are derived from the HECS 7 output signals.

Operation of the TRIP SOLENOID 25/62/78 is code-driven and triggered by pressing the TRIP BUTTON 71 or by the occurrence of any of the different electrical fault conditions the PSD is designed for, including miswire, Operation of the RESET SOLENOID 24/78 is code-driven through a RESET BUTTON 70. In case of manual-RESET PSDs, there is no RESET SOLENOID but instead a manually-operated RESET BUTTON 58 is used to mechanically latch the CONTACTOR CONTACTS 59.

BRIDGE RECTIFIERS 33/34 are each connected on the LINE-SIDE and the LOAD-SIDE of the PSD. This is to ensure that DC power supply is always available to the PSD even when LINE-LOAD miswire occurs on the main AC power supply connection. With this set-up, power is always available to the DC power-driven components of the PSD even when a miswire condition exists, provided that the main AC power supply is on. The DC power-driven components include the MICROPROCESSOR 11, the CURRENT SENSOR 7 and OPTOCOUPLERS 31/32/38/51/66/82. Optional AUXILIARY CONTACTS 47/48/60/61/76/77 are shown as part of the CONTACTOR 12/57/74 for any additional switching, feedback or signaling functions.

The LINE-NEUTRAL INDICATOR CIRCUIT 56 with RESISTORS 52/53 and OPTOCOUPLER 51 is connected across NEUTRAL 2/54 and GROUND 3. This circuit feeds back signal to the MICROPROCESSOR 11 to determine when the LINE 1 and NEUTRAL 2 wiring connections are reversed. Through the PSD's MICROPROCESSOR code routines for monitoring and detection of system conditions and faults, the contactor trips when a miswire occurs.

When the PSD is properly wired, the LINE-NEUTRAL INDICATOR CIRCUIT 56 is normally connected to NEUTRAL 2/54. Since the NEUTRAL 2 potential with the GROUND 3 is practically zero or negligibly low and not enough to trigger the OPTOCOUPLER 51, this FEEDBACK 73 considered logic "HIGH" to MICROPROCESSOR 11 which indicates proper wiring or that no miswire condition exists. This is according to MICROPROCESSOR 11 LOGIC CONTROL set-up.

If the LINE 1 and NEUTRAL 2 wiring connections are reversed, the LINE-NEUTRAL INDICATOR CIRCUIT 56 is connected to the LINE instead of NEUTRAL. In this case, there is a potential in the LINE-NEUTRAL indicator circuit across LINE 1/55 and GROUND 3 driving the OPTOCOUPLER 51 with a FEEDBACK 73 considered logic "LOW" to MICROPROCESSOR 11 which indicates improper wiring or the existence of a miswire condition. By the PSD MICROPROCESSOR 11 code routine the TRIP SOLENOID 25/62/78 is activated, tripping the CONTACTOR 12/57/74 and switching the ANNUNCIATION CIRCUIT 17/18 with corresponding audible and/or visual indications. The MICROPROCESSOR 11 logic control set-up for the FEEDBACK 73 from the LINE-NEUTRAL INDICATOR CIRCUIT 56 may alternatively be reversed where connection to the LINE 1/55 could indicate a normal condition and connection to NEUTRAL 2/54 as a miswire condition.

A TRIP/RESET INDICATOR CIRCUIT 14 is connected across LINE 4 and NEUTRAL 5 on the LOAD side of the PSD. The MICROPROCESSOR 11 logic control for the TRIP/RESET INDICATOR CIRCUIT 14 is set up where current flow to the circuit indicates a RESET position and absence of current flow indicates a TRIP condition. When the PSD is wired properly and the CONTACTOR 12/57/74 is in OFF position with the main power supply ON, the CONTACTS 45/59/75 are open and therefore there is no power to the LOAD side of the PSD. At this point there is no current flow to the TRIP/RESET INDICATOR CIRCUIT 14 and the FEEDBACK 44 to MICROPROCESSOR 11 considered logic "HIGH" which indicates that the contactor is on TRIP position. When the CONTACTOR 12/57/74 is RESET, current flows through the TRIP/RESET INDICATOR CIRCUIT 14 triggering the OPTOCOUPLER 38 with a FEEDBACK 44 to MICROPROCESSOR 11 considered logic "LOW" which indicates that the CONTACTOR 12 is on RESET. The MICROPROCESSOR 11 LOGIC CONTROL set-up for the TRIP/RESET INDICATOR CIRCUIT 14 feedback may alternatively be reversed by the PSD code routine to indicate the opposite conditions. The TRIP/RESET INDICATOR CIRCUIT 14 may alternatively be connected across LINE and GROUND instead of LINE and NEUTRAL for the same purpose and using the same principle above. As well, the TRIP/RESET INDICATOR CIRCUIT 14 may alternatively be connected across one of the AUXILIARY CONTACTS 47/48/60/61/76/77 and the DC POWER SUPPLY instead of LINE and NEUTRAL for the same purpose and using the same principle above.

PULL-UP RESISTORS 68/68A are used for the MICROPROCESSOR 11 logic control for switching of TRIP and RESET circuits. They are intended to ensure the input to the MICROPROCESSOR 11 Logic control system is at the expected logic levels.

For a PSD with a CONTACTOR 57 which has a solenoid-actuated TRIP and manually-actuated RESET, a PULL-UP resistor is connected in series with the auxiliary contact NO 60 to GROUND. When the TRIP BUTTON 71 is open, the voltage of the MICROPROCESSOR 11 gate input is pulled up to the level of the input voltage or the DC POWER SUPPLY voltage which is considered logic "High". When the TRIP BUTTON 71 is closed, the input voltage at the gate goes to ground which is considered logic "LOW". Alternatively, through the MICROPROCESSOR 11 code routine, the Logic set-up may be reversed for indications opposite to the above. Likewise, a PULL-DOWN resistor circuit may be used in lieu of a PULL-UP resistor circuit, with corresponding change in the MICROPROCESSOR 11 logic set-up, applying the same principles disclosed in this invention.

For a PSD with solenoid-actuated TRIP and RESET, PULL-UP RESISTORS 68/68A are used with the RESET BUTTON 70 and TRIP BUTTON 71. The PULL-UP RESIS- TORS 68/68A may also use the auxiliary contacts NO 47/76 or NC 48/77 in the same principle above. Likewise, a PULL-DOWN resistor circuit may be used in lieu of a PULL-UP resistor circuit, with corresponding change in the MICROPROCESSOR 11 logic set-up, applying the same principles disclosed in this invention.

As an additional or optional system for TRIP/RESET indication, the MICROPROCESSOR 11 Non Volatile Memory (NVM) may be used in conjunction with the TRIP/RESET INDICATOR CIRCUIT 14 or independently to identify the contactor position of the PSD on its last operation cycle. This could be incorporated in the PSD code routine as a means to confirm the contactor position.

In prior arts, the annunciation system used with PSDs is generally confined with LED display to indicate ON and OFF conditions, where the former is represented by a Green-colored LED and the latter by a red-colored LED. The red-colored LED is also an indication that the PSD tripped by pressing the TRIP BUTTON 71 or due to a fault as a general method of annunciation and without distinction or identification of which fault occurs. The current invention involves a code-driven system and method of annunciating system conditions and faults that occur in a PSD. The annunciation system is code-driven by feedback received from the PSD miswire and other detection systems. Annunciation could be through a variety or combination of audible alarms and visual display of system conditions and faults. Through the MICROPROCESSOR 11 algorithm-based code, every system condition and fault that occur in a PSD are defined. Said audible alarm or indication and visual display include such sounds as siren, buzz, or any distinct tone or pre-recorded and coded messages to annunciate specific system conditions or faults. The said visual display includes such as alphabetic, numeric, alpha-numeric or graphic display, colored or plain, to annunciate system conditions or faults through Light Emitting Diodes, Liquid Crystal Display, or other forms. Table 1 indicates some of the most common ways of annunciating system conditions and faults that occur in a PSD. This is only an illustration and not limiting but is intended to give certain possibilities within the scope of this invention.

The main components of the annunciation system is composed indiscriminately of all the PSD components for control and monitoring system conditions and faults as disclosed in the embodiments of this invention, and specifically the microprocessor which drives all the PSD's programmable functions. Monitored system conditions include voltage, current, wattage or energy consumption, power on or off, and electrical faults such as and including arc, overload, short circuit, ground and miswire.

A built-in or external speaker is used to annunciate different system conditions and the identifying names or codes for different faults that occur by use of sound alarms or pre-recorded messages. LED indicators or LCD displays with graphic, alphabetic, numeric and alpha-numeric display are used for visual indications of system conditions and faults. This invention, with proper interface also allows the visual and audible annunciation system to be transmitted and displayed on a remote location or panel through wired or wireless means. Remote operation of the TRIP and RESET functions may be done through the same interface. Exclusion applies for manual RESET 58 operation.

PSDs are designed to provide specific features and protection from different electrical faults that among others include arc, ground, short circuit, overload, surge, and miswire is an added feature. Although the PSDs made exemplary to the current invention are MICROPROCESSOR-based where all the monitoring, control and annunciation are code-driven and algorithm-based, the same system and method or principles disclosed in this invention also apply to non-MICROPROCESSOR-based PSDs with appropriate circuitry to adapt and accommodate them.

PSD code routines operate on a continuous loop to monitor system conditions, detect faults or system abnormalities, and interrupt the circuit when a fault occurs including miswire. Every electrical fault has specific characteristics or signatures which through comparative analysis, are identified. Through algorithm-based PSD code routines, a TRIP flag is initiated when a fault occurs which activates the TRIP circuit 13, the TRIP SOLENOID 25/62/78 and ultimately the CONTACTOR CONTACTS 45/59/75 are opened, simultaneously activating audible and visual annunciations 17/18. Through the PSD's MICROPROCESSOR code routines, every electrical fault is identified and corresponding visual and audible annunciations are activated when they occur.

PSDs differ in the methods and means of switching RESET and TRIP functions, however, the system and method of miswire protection of the current invention applies to all types with minor variation in the way they are applied. Among the most common and basic types of PSDs to which the current invention applies include the following:

A) PSD utilizing a double-solenoid contactor with solenoid-actuated TRIP and RESET operation.

B) PSD utilizing a solenoid-actuated TRIP and a manually-operated RESET operation.

C) PSD utilizing a contactor with a single and common solenoid for TRIP and RESET operations with integrated locking and unlocking mechanisms.

D) PSD with a contactor using a single solenoid for TRIP and RESET operations with a magnetic latch to maintain RESET.

To better understand the system and method of miswire protection of a PSD described in (A) above with double-solenoid contactor where the TRIP and RESET mechanisms are operated by independent solenoids, different system conditions are described in details below:

1. When the PSD is wired properly, main power supply ON and the contactor RESET BUTTON 70 is pressed:

the DC POWER SUPPLY CIRCUIT 35 is connected through the BRIDGE RECTIFIER 33 and supplies the PSD control and monitoring circuit;

the LINE-NEUTRAL MISWIRE INDICATOR CIRCUIT 56 is connected to the NEUTRAL 2/54 on the LINE side of the PSD;

as soon as the RESET BUTTON 70 is pressed, the RESET signal is received by the MICROPROCESSOR 11 and executes its RESET code routine;

since the PSD is properly wired, the LINE-NEUTRAL INDICATOR CIRCUIT 56 feeds back to MICROPROCESSOR 11 for normal condition;

through the MICROPROCESSOR code routine, RESET COMMAND 42 is initiated, RESET SOLENOID 24 is activated by SCR 27, the CONTACTOR CONTACTS 45 close, power is connected to the LOAD side of the PSD, and eventually the BRIDGE RECTIFIER 34 is connected to the LOAD-SIDE AC LINE;

the contactor auxiliary contacts NO 47 closes and NC 48 opens;

the TRIP/RESET INDICATOR CIRCUIT 14 feeds back signal to the MICROPROCESSOR 11 indicating normal condition;

by the PSD code routines the corresponding visual and audible indications for RESET condition are activated; and the PSD operates normally and its code routines go on continuous loop monitoring system conditions and detecting electrical faults which include miswire.
2. When the PSD is wired properly, main power supply connected, CONTACTOR CONTACTS 45 are on RESET and the contactor TRIP BUTTON 71 is pressed:
   the DC POWER SUPPLY CIRCUIT 35 is supplied through the BRIDGE RECTIFIER 33 in parallel with BRIDGE RECTIFIER 34, and supplies the PSD control and monitoring circuit;
   the LINE-NEUTRAL MISWIRE INDICATOR CIRCUIT 56 is connected to the NEUTRAL 2/54 on the LINE side of the PSD;
   all systems are in normal condition and the PSD executes its regular code routines before the TRIP BUTTON 71 is pressed;
   as soon as the TRIP BUTTON 71 is pressed, the TRIP code routine is initiated, the TRIP circuit is powered up and the OPTOCOUPLER 32 pulses, triggering the SCR 28 to activate the TRIP SOLENOID 25 and open the CONTACTOR CONTACTS 45 where then the PSD is turned OFF.
   the contactor auxiliary contacts 47 and 48 return to their normal positions; and
   the TRIP/RESET INDICATOR CIRCUIT 14 feeds back signal to the MICROPROCESSOR 11 indicating TRIP position and by the PSD code routine activates the corresponding visual and audible indications.
3. When the PSD is miswired with LINE-SIDE and LOAD-SIDE wiring reversed, main power supply connected and the RESET BUTTON is pressed:
   the DC POWER SUPPLY CIRCUIT 35 is supplied through the BRIDGE RECTIFIER 34 and power to the PSD control and monitoring circuit is on;
   before the RESET BUTTON 70 is pressed and with the power already connected on the LOAD side, the TRIP/RESET circuit 14 feeds back signal to MICROPROCESSOR 11 indicating the contactor is on RESET position although it is physically not; and meantime remains in the TRIP position;
   as soon as the RESET BUTTON 70 is pressed, the PSD code routine starts, calling out the RESET code routine, activating the RESET SOLENOID 24, however, since there is a pre-existing RESET position feedback from the TRIP/RESET INDICATOR CIRCUIT 14 as a result of the LINE-SIDE to LOAD-SIDE reverse wiring, by the PSD code routine it will be an indication that a miswire condition exists and the PSD will simultaneously call out a TRIP routine which will then activate the TRIP SOLENOID 25 through the TRIP/RESET CIRCUIT 13, opening the CONTACTOR CONTACTS 45, activating the corresponding audible and visual annunciations; and.
   the PSD will continue to TRIP whenever the RESET BUTTON 70 is pressed until the miswire condition is corrected.
4. When the PSD is miswired with the LINE 1 and NEUTRAL 2 wiring reversed on the LINE side, main power supply on and when the RESET BUTTON 70 is pressed:
   the DC POWER SUPPLY CIRCUIT 35 is supplied through the BRIDGE RECTIFIER 33 and power to the PSD control and monitoring circuit is on;
   before the RESET BUTTON 70 is pressed the LINE-NEUTRAL MISWIRE INDICATOR CIRCUIT 56 feeds back signal to MICROPROCESSOR 11 indicating a miswire condition since there is current flow to the LINE-NEUTRAL INDICATOR CIRCUIT 56 by having it connected across LINE and GROUND, and meantime the CONTACTOR 12 remains on the TRIP position;
   as soon as the RESET BUTTON 70 is pressed, the PSD initiates its RESET code routine, activating the RESET SOLENOID 24, however, since the feedback from the LINE-NEUTRAL MISWIRE INDICATOR CIRCUIT 56 as a result of the LINE-SIDE LINE-NEUTRAL reverse wiring indicates a miswire condition, the PSD will simultaneously call out a TRIP routine which will then activate the TRIP SOLENOID 25 through the TRIP/RESET CIRCUIT 13, opening the CONTACTOR CONTACTS 45, activating the corresponding audible and visual annunciations; and.
   the PSD will continue to TRIP whenever the RESET BUTTON 70 is pressed until the miswire condition is corrected.
5. When the RESET BUTTON 70 is pressed, main power supply is on and when the PSD is miswired with the LINE 4 and NEUTRAL 5 wiring reversed on the LOAD side, the PSD operates as in normal condition. The LOAD side connections are reversible as far as the PSD is concerned and it will not be considered a miswire condition.
6. When the PSD is in RESET, main power supply on and in normal operating condition, and an electrical fault such as and including arc, ground, overload, short circuit occurs excluding miswire:
   by the PSD code routine, the fault is identified and verified;
   a TRIP flag is initiated and the trip circuit is energized;
   the TRIP SOLENOID 25 is activated, opening the CONTACTOR CONTACTS 45;
   simultaneously, code routine calls for visual and/or audible annunciation;
   visual annunciation is displayed through LED, graphic, alphabetic, numeric or alpha-numeric LCD of system condition or fault that occurred;
   audible annunciation initiates simultaneously through a beep, buzz, bell or any desired sound, continuous or intermittent, including pre-recorded messages through the PSD's built-in speaker system;
   the PSD will continue to TRIP whenever the RESET BUTTON 70 is pressed with the associated annunciation until the fault condition is corrected.

The system and method of miswire protection of a PSD described in (B) above with a solenoid-actuated TRIP and a manual RESET are described in details under normal conditions and different miswire situations:
1. When the PSD is wired properly, main power supply connected and the contactor RESET BUTTON 70 is pressed:
   the DC POWER SUPPLY CIRCUIT 35 is supplied through the BRIDGE RECTIFIER 33 and supplies the PSD control and monitoring circuit;
   the LINE-NEUTRAL INDICATOR CIRCUIT 56 is connected to the NEUTRAL 2/54 on the LINE side of the PSD;
   as soon as the manual RESET BUTTON 58 is pressed, the MICROPROCESSOR executes its RESET code routine;
   since the PSD is properly wired, the LINE-NEUTRAL INDICATOR CIRCUIT 56 feeds back normal conditions to MICROPROCESSOR 11;
   simultaneously, the CONTACTOR CONTACTS 59 close and the LOAD side of the PSD is energized, eventually, the BRIDGE RECTIFIER 34 is connected to the LOAD-SIDE AC LINE;

simultaneously, the contactor auxiliary contacts NO 60 closes and NC 61 opens;

the TRIP/RESET INDICATOR CIRCUIT 14 feeds back signal to the MICROPROCESSOR 11 indicating normal condition;

by the PSD code routines, the corresponding visual and audible indications are activated; and the PSD operates normally and the PSD code routines go on continuous loop monitoring system conditions and detecting electrical faults which include miswire.

2. When the PSD is wired properly, main power supply connected, CONTACTOR CONTACTS 59 are on RESET and the contactor TRIP BUTTON 71 is pressed:

the DC POWER SUPPLY CIRCUIT 35 is powered through the BRIDGE RECTIFIER 33 in parallel with BRIDGE RECTIFIER 34, and supplies the PSD control and monitoring circuit;

the LINE-NEUTRAL INDICATOR CIRCUIT 56 is connected to the NEUTRAL 2/54 on the LINE side of the PSD;

all systems are in normal condition and the PSD is on its regular code routines before the TRIP BUTTON is pressed;

as soon as the TRIP BUTTON 71 is pressed, the TRIP command is received by the MICROPROCESSOR and executes its TRIP code routine;

the TRIP CIRCUIT 72 is powered up and the OPTO-COUPLER 66 pulses, triggering the SCR 63 to activate the TRIP SOLENOID 62 and open the CONTACTOR CONTACTS 59 where then the PSD is turned OFF.

the contactor auxiliary contacts 60 and 61 return to their normal positions; and the TRIP/RESET INDICATOR CIRCUIT 14 feeds back signal to the MICROPROCESSOR 11 indicating TRIP position and by the PSD code routines activate the corresponding visual and audible indications.

3. When the PSD is miswired with LINE and LOAD-SIDE wiring reversed, main power supply connected and the RESET BUTTON 58 is pressed:

the DC POWER SUPPLY CIRCUIT 35 is supplied through the BRIDGE RECTIFIER 34 and power to the PSD control and monitoring circuit is on;

before the RESET BUTTON 58 is pressed and with the power already connected on the LOAD side, the TRIP/RESET circuit 14 feeds back signal to MICROPROCESSOR 11 indicating the contactor is on RESET position although it is physically not; and meantime PSD remains in the TRIP position;

as soon as the RESET BUTTON 58 is pressed, the CONTACTOR CONTACTS close and the PSD code routine starts however, since there is a pre-existing RESET position feedback from the TRIP/RESET INDICATOR CIRCUIT 14 as a result of the LINE-SIDE to LOAD-SIDE reverse wiring, by the PSD code routine it will be determined that a miswire condition exists and the PSD will simultaneously call out a TRIP routine which will then activate the TRIP SOLENOID 25 through the TRIP circuit 72, opening the CONTACTOR CONTACTS 59, activating the corresponding audible and visual annunciations; and.

the PSD will continue TRIP whenever the RESET BUTTON 58 is pressed and until the miswire condition is corrected.

4. When the PSD is miswired with the LINE and NEUTRAL wiring reversed on the LINE side, main power supply on and when the RESET BUTTON 58 is pressed:

the DC POWER SUPPLY CIRCUIT 35 is supplied through the BRIDGE RECTIFIER 33 and power to the PSD control and monitoring circuit is on;

before the RESET BUTTON 58 is pressed, the LINE-NEUTRAL MISWIRE INDICATOR CIRCUIT 56 feeds back signal to MICROPROCESSOR 11 indicating the miswire condition, and meantime the CONTACTOR 57 remains on the TRIP position;

as soon as the RESET BUTTON 58 is pressed, the CONTACTOR CONTACTS 59 close and the LOAD side of the PSD is energized, and eventually, the BRIDGE RECTIFIER 34;

the PSD code routine starts, however, since there is a feedback from the LINE-NEUTRAL MISWIRE INDICATOR CIRCUIT 56 as a result of the LINE-SIDE LINE NEUTRAL reverse wiring, by the PSD code routine it will be determined that a miswire condition exists;

the PSD will simultaneously call out a TRIP routine which will then activate the TRIP SOLENOID 62 through the TRIP/RESET circuit 72, opening the CONTACTOR CONTACTS 59, activating the corresponding audible and visual annunciations; and.

the contactor auxiliary contacts NO 60 closes and NC 61 opens;

the PSD will continue to trip whenever the RESET BUTTON 70 is pressed and until the miswire condition is corrected.

5. When the RESET BUTTON 70 is pressed, main power supply is on and when the PSD is miswired with the LINE 4 and NEUTRAL 5 wiring reversed on the LOAD side, the PSD operates as in normal condition. The LOAD side connections are reversible as far as the PSD is concerned and it will not be considered a miswire condition.

6. When the PSD is in RESET, main power supply on and in normal operating condition, and an electrical fault such as and including arc, ground, overload, short circuit occurs including miswire:

by the PSD code routine, the fault is identified and verified;

a TRIP flag is initiated and the trip circuit is energized;

the TRIP SOLENOID 62 is activated, opening the CONTACTOR CONTACTS 59;

simultaneously, code routine calls for visual and/or audible annunciation;

visual annunciation comes simultaneously through LED, graphic, alphabetic, numeric or alpha-numeric LCD of system condition or fault that occurred;

audible annunciation comes simultaneously through a beep, buzz, bell or any other sound, continuous or intermittent, including pre-recorded messages through the PSDs built-in speaker system.

the PSD will continue to trip whenever the RESET BUTTON 70 is pressed and until the fault condition is corrected.

The system and method of miswire protection of a PSD described in (C) above with a single-solenoid-actuated TRIP and RESET are described in details under normal conditions and different miswire situations:

1. When the PSD is wired properly, main power supply connected and the contactor RESET BUTTON 70 is pressed:

the DC POWER SUPPLY CIRCUIT 35 is supplied through the BRIDGE RECTIFIER 33 and supplies the PSD control and monitoring circuit;

the LINE-NEUTRAL INDICATOR CIRCUIT 56 is connected to the NEUTRAL on the LINE side of the PSD;

as soon as the RESET BUTTON 70 is pressed, the RESET signal is received by the MICROPROCESSOR 11 and executes its RESET code routine;

since the PSD is properly wired, the LINE-NEUTRAL INDICATOR CIRCUIT 56 feeds back normal conditions to MICROPROCESSOR 11;

the CONTACTOR CONTACTS 75 close and the LOAD side of the PSD is powered, and eventually the BRIDGE RECTIFIER 34;

simultaneously, the contactor auxiliary contacts NO 76 closes and NC 77 opens;

the TRIP/RESET INDICATOR CIRCUIT 14 feeds back signal to the MICROPROCESSOR 11 indicating normal condition;

by the PSD code routines, the corresponding visual and audible indications are activated; and the PSD operates normally and the PSD code routines go on continuous loop monitoring system conditions and detecting electrical faults which include miswire.

2. When the PSD is wired properly, main power supply connected, CONTACTOR CONTACTS 75 are on RESET and the contactor TRIP BUTTON 71 is pressed:

the DC POWER SUPPLY CIRCUIT 35 is supplied through the BRIDGE RECTIFIER 33 in parallel with BRIDGE RECTIFIER 34, and supplies the PSD control and monitoring circuit;

the LINE-NEUTRAL INDICATOR CIRCUIT 56 is connected to the NEUTRAL 2/54 on the LINE side of the PSD;

all systems are in normal condition and the PSD is on its regular code routines before the TRIP BUTTON is pressed;

as soon as the TRIP BUTTON 71 is pressed, the TRIP command is received by the MICROPROCESSOR 40 and executes its TRIP code routine;

the TRIP CIRCUIT 84 which in this type of contactor is the same as the RESET CIRCUIT 84 is powered up and the OPTOCOUPLER 82 pulses, triggering the SCR 79 to activate the TRIP and RESET SOLENOID 78 and open the CONTACTOR CONTACTS 75 where then the PSD is turned OFF.

the contactor auxiliary contacts 76 and 77 return to their normal positions; and the TRIP/RESET INDICATOR CIRCUIT 14 feeds back signal to the MICROPROCESSOR 11 indicating TRIP position and by the PSD code routines activate the corresponding visual and audible indications.

3. When the PSD is miswired with LINE and LOAD-SIDE wiring reversed, main power supply connected and the RESET BUTTON 70 is pressed:

the DC POWER SUPPLY CIRCUIT 35 is supplied through the BRIDGE RECTIFIER 34 and power to the PSD control and monitoring circuit is on;

before the RESET BUTTON 70 is pressed and with the power already connected on the LOAD side, the TRIP/RESET circuit 14 feeds back signal to MICROPROCESSOR 11 indicating the contactor is on RESET position although it is physically not; and meantime the PSD remains in the TRIP position;

as soon as the RESET BUTTON 70 is pressed, the CONTACTOR CONTACTS 75 close and the PSD code routine starts however, since there is a pre-existing RESET position feedback from the TRIP/RESET INDICATOR CIRCUIT 14 as a result of the LINE-SIDE to LOAD-SIDE reverse wiring, by the PSD code routine it will be determined that a miswire condition exists and the PSD will simultaneously call out a TRIP routine which will then activate the TRIP SOLENOID 78 through the TRIP circuit 84, opening the CONTACTOR CONTACTS 75, activating the corresponding audible and visual annunciations; and.

the PSD will continue to trip whenever the RESET BUTTON 70 is pressed and until the miswire condition is corrected.

4. When the PSD is miswired with the LINE and NEUTRAL wiring reversed on the LINE side, main power supply on and when the RESET BUTTON 70 is pressed:

the DC POWER SUPPLY CIRCUIT 35 is supplied through the BRIDGE RECTIFIER 33 and power to the PSD control and monitoring circuit is on;

before the RESET BUTTON 70 is pressed, the LINE-NEUTRAL MISWIRE INDICATOR CIRCUIT 56 feeds back signal to MICROPROCESSOR 11 indicating the miswire condition, and meantime the contactor 74 remains on the TRIP position;

as soon as the RESET BUTTON 70 is pressed, the CONTACTOR CONTACTS 75 close and the LOAD side of the PSD is powered up, and eventually, the BRIDGE RECTIFIER 34;

the PSD code routine starts, however, since there is a feedback from the LINE-NEUTRAL MISWIRE INDICATOR CIRCUIT 56 as a result of the LINE-SIDE LINE-NEUTRAL reverse wiring, by the PSD code routines it will be determined that a miswire condition exist;

the PSD will simultaneously call out a TRIP routine which will then activate the TRIP SOLENOID 78 through the TRIP/RESET circuit 84, opening the CONTACTOR CONTACTS 75, activating the corresponding audible and visual annunciations;

the contactor auxiliary contacts NO 76 closes and NC 71 opens; and the PSD will continue to TRIP whenever the RESET BUTTON is pressed and until the miswire condition is corrected.

5. When the RESET BUTTON 70 is pressed, main power supply is on and when the PSD is miswired with the LINE 4 and NEUTRAL 5 wiring reversed on the LOAD side, the PSD operates as in normal condition. The LOAD side connections are reversible and it will not be considered a miswire condition.

6. When the PSD is on RESET, main power supply on and in normal operating condition, and an electrical fault such as and including arc, ground, overload, short circuit occurs excluding miswire:

by the PSD code routine, the fault is identified and verified;

a TRIP flag is initiated and the trip circuit is energized;

the TRIP SOLENOID 78 is activated, opening the CONTACTOR CONTACTS 75;

simultaneously, code routine calls for visual and/or audible annunciation;

visual annunciation comes simultaneously through LED, graphic, alphabetic, numeric or alpha-numeric LCD of system condition or fault that occurred;

audible annunciation comes simultaneously through a beep, buzz, bell or any other sound, continuous or intermittent, including pre-recorded messages through the PSDs built-in speaker system.

the PSD will continue to trip whenever the RESET BUTTON is pressed and until the fault condition is corrected.

The system and method of miswire protection of a PSD described in (D) above with a single-solenoid-actuated TRIP and RESET using a latching mechanism to maintain RESET position follows the same principles as (B) above except that the a magnetic latch is used in lieu of MANUAL RESET 58. Without limitations, the other principles described in the current invention may also be applied.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. A microprocessor-based system for miswire protection integrated with known circuit protection systems and devices, said microprocessor-based system improving the scope of said known protection systems and devices protection, said microprocessor-based miswire protection system comprising: having a microprocessor-based circuit protection system, having a switched-mode-power-supply Direct current (DC) power supply to said system, connecting to the Line-side and Load-side terminal connections in said system, processing data inputs and outputs through the system's microprocessor, said microprocessor monitoring and controlling the system's entire circuit, said system detecting a miswire fault, having a voltage divider circuit in said system, having a tripping circuit in said system, having a trip mechanism in said system, having a contactor in said system, having a means for resetting a tripped circuit in said system, having a means for indicating a trip/reset in said system, having a means to reset the tripped mechanism in said system, having a means to annunciate faults and other conditions in said system, having a means for interconnecting said integrated system elements, wherein said microprocessor-based circuit protection system is code-driven, said code is algorithm-based and said algorithm having a miswire protection system integrated therein, said algorithm-based code having all the possible miswire conditions programmed therein, said programmed miswire conditions being Line-Load reversal, Line-side-Line and Neutral reversal, Line and Load side cross-wiring.

2. The system of claim 1 further being integrated with protection systems and devices for electrical faults including arcs, overload, short circuit, and ground.

3. The system of claim 2 wherein the circuit elements for miswire detection are integrated with said arc, overload, short circuit, and ground protection systems, and said arc, overload, short circuit, surge and ground protection systems utilize their own microprocessor and sensor fault detection elements and circuits to identify and annunciate said arc, overload, short circuit, and ground faults.

4. The system of claim 2 wherein said miswire fault protection system microprocessor is the microprocessor for said integrated arc, overload, short circuit, and ground protection systems, including receiving input signals from the monitoring circuit, processing them according to algorithm-based code, executing commands to trip the circuit, annunciating the occurrence of faults and identifying them for diagnostic purposes.

5. The system of claim 1, wherein said DC power supply includes a voltage regulator and a set of two bridge rectifiers connected in parallel across the Line and Load sides of said miswire fault protection system, said bridge rectifiers feeding a switch-mode-power-supply circuit thereby providing a continuous supply of power to the DC power driven components of said protection system.

6. The system of claim 1 wherein the voltage divider circuit is connected across the Line-Side-Line and Line-Side-Neutral connections of the protection system and device to ensure that there is always AC Line synchronization for the protection system and device monitoring and control systems, regardless if the Line and Neutral connections are miswired.

7. The system of claim 1 wherein the Line-Neutral indicator circuit is connected between Line or Neutral and Ground to provide a signal to the microprocessor to determine a line-neutral miswire condition according to said microprocessor's code, wherein said Trip/Reset indicator circuit provides a signal to the microprocessor to determine the trip and reset mechanism's trip status, and wherein the Line-Neutral indicator signal together with the Trip/Reset indicator signal are used by said microprocessor to determine the occurrence of a miswire fault condition, and then trip the circuit and activate said fault annunciation elements.

8. The system of claim 1, wherein the means to annunciate faults includes having an audible alarm and visual display of system conditions and faults, where said alarm and visual display identifies the specific faults that occurred.

9. The annunciation element of the system of claim 8 which includes monitoring and metering of system conditions such as voltage, current, wattage or energy consumption, and where said annunciation system element is integrated within the protection system and device itself or remotely through a wireless interface, said wireless interface transmitting system conditions and faults, and receiving commands to trip or reset the device.

10. A method for having a microprocessor-based system for miswire protection integrated with known circuit protection systems and devices, said microprocessor-based system improving the scope of said known protection systems and devices protection, said microprocessor-based miswire protection system comprising: the step of having a microprocessor-based circuit protection system, the step of providing a switched-mode-power-supply Direct current (DC) power supply to said system, the step of connecting to the Line-side and Load-side terminal connections in said system, the step of processing data inputs and outputs through the system's microprocessor, the step of said microprocessor monitoring and controlling the system's entire circuit, the step of said system detecting a miswire fault, the step of having a voltage divider circuit in said system, the step of having a tripping circuit in said system, the step of having a trip mechanism in said system, the step of having a contactor in said system, the step of having a means for resetting a tripped circuit in said system, the step of having a means for indicating a trip/reset in said system, the step of having a means to reset the tripped mechanism in said system, the step of having a means to annunciate faults and other conditions in said system, the step of having a means for interconnecting said integrated system elements, the step of said microprocessor-based circuit protection system being code-driven, said code is algorithm-based and said algorithm having a miswire protection system integrated therein, said algorithm-based code having all the possible miswire conditions programmed therein, said programmed miswire conditions being Line-Load reversal, Line-side-Line and Neutral reversal, Line and Load side cross-wiring.

11. The method of claim 10 further being integrated with protection systems and devices for electrical faults including arcs, overload, short circuit, and ground.

12. The method of claim 11, wherein the circuit elements for miswire detection are integrated with said arc, overload, short circuit, and ground protection systems, and said arc, overload, short circuit, surge and ground protection systems utilize their own microprocessor and sensor fault detection elements and circuits to identify and annunciate said arc, overload, short circuit, surge and ground faults.

13. The method of claim 11 wherein said miswire fault protection system microprocessor is the microprocessor for said integrated arc, overload, short circuit, and ground protection systems, including receiving input signals from the monitoring circuit, processing them according to algorithm-based code, executing commands to trip the circuit, annunciating the occurrence of faults and identifying them for diagnostic purposes.

14. The method of claim 10, wherein said DC power supply includes a voltage regulator and a set of two bridge rectifiers connected in parallel across the Line and Load sides of said miswire fault protection system, said bridge rectifiers feeding a switch-mode-power-supply circuit thereby providing a continuous supply of power to the DC power driven components of said protection system.

15. The method of claim 10 wherein the voltage divider circuit is connected across the Line-Side-Line and Line-Side-Neutral connections of the protection system and device to ensure that there is always AC Line synchronization for the protection system and device monitoring and control systems, regardless if the Line and Neutral connections are miswired.

16. The method of claim 10 wherein the Line-Neutral indicator circuit is connected between Line or Neutral and Ground to provide a signal to the microprocessor to determine a line-neutral miswire condition according to said microprocessor's code, wherein said Trip/Reset indicator circuit provides a signal to the microprocessor to determine the trip and reset mechanism's trip status, and wherein the Line-Neutral indicator signal together with the Trip/Reset indicator signal are used by said microprocessor to determine the occurrence of a miswire fault condition, and then trip the circuit and activate said fault annunciation elements.

17. The method of claim 10, wherein the means to annunciate faults includes having an audible alarm and visual display of system conditions and faults, wherein said alarm and visual display identifies the specific faults that occurred.

18. The annunciation element of the method of claim 17 which includes monitoring and metering of system conditions such as voltage, current, wattage or energy consumption, and where said annunciation system element is integrated within the protection system and device itself or remotely through a wireless interface, said wireless interface transmitting system conditions and faults, and receiving commands to trip or reset the device.

* * * * *